United States Patent
Kaneko et al.

(10) Patent No.: US 12,255,073 B2
(45) Date of Patent: Mar. 18, 2025

(54) SILICON CARBIDE SUBSTRATE MANUFACTURING METHOD, SILICON CARBIDE SUBSTRATE, AND METHOD OF REMOVING STRAIN LAYER INTRODUCED INTO SILICON CARBIDE SUBSTRATE BY LASER PROCESSING

(71) Applicants: KWANSEI GAKUIN EDUCATIONAL FOUNDATION, Hyogo (JP); TOYOTA TSUSHO CORPORATION, Aichi (JP)

(72) Inventors: Tadaaki Kaneko, Sanda (JP); Daichi Dojima, Sanda (JP)

(73) Assignees: KWANSEI GAKUIN EDUCATIONAL FOUNDATION, Hyogo (JP); TOYOTA TSUSHO CORPORATION, Aichi (JP)

( * ) Notice: Subject to any disclaimer, the term of this patent is extended or adjusted under 35 U.S.C. 154(b) by 250 days.

(21) Appl. No.: 17/996,193

(22) PCT Filed: Mar. 30, 2021

(86) PCT No.: PCT/JP2021/013747
§ 371 (c)(1),
(2) Date: Oct. 13, 2022

(87) PCT Pub. No.: WO2021/210394
PCT Pub. Date: Oct. 21, 2021

(65) Prior Publication Data
US 2023/0197456 A1    Jun. 22, 2023

(30) Foreign Application Priority Data
Apr. 14, 2020 (JP) .................. 2020-072551

(51) Int. Cl.
*H01L 21/3065* (2006.01)
*H01L 21/268* (2006.01)

(52) U.S. Cl.
CPC ........ *H01L 21/3065* (2013.01); *H01L 21/268* (2013.01)

(58) Field of Classification Search
None
See application file for complete search history.

(56) References Cited

U.S. PATENT DOCUMENTS

| 6,257,224 B1 | 7/2001 | Yoshino et al. |
| 2017/0053829 A1 | 2/2017 | Hirata et al. |

(Continued)

FOREIGN PATENT DOCUMENTS

| EP | 3128535 A1 | 2/2017 |
| JP | H10-305420 A | 11/1998 |

(Continued)

OTHER PUBLICATIONS

Extended European Search Report from EP Application No. 21789347.8 dated Mar. 15, 2024.

(Continued)

*Primary Examiner* — Stephanie P Duclair
(74) *Attorney, Agent, or Firm* — Calfee, Halter & Griswold LLP

(57) ABSTRACT

The problem to addressed by the present invention is that of providing a novel technique that can remove a strained layer introduced into a silicon carbide substrate by laser processing. The present silicon carbide substrate manufacturing method involves a processing step for performing laser processing to remove part of a silicon carbide substrate by irradiating the silicon carbide substrate with a laser, and a strained layer removal step for removing a strained layer that was introduced in the silicon carbide substrate by the (Continued)

aforementioned processing step involving heat treatment of the silicon carbide substrate. In this way, the present invention, which is a method of removing a strained layer introduced into a silicon carbide substrate by laser processing, involves a strained layer removal step for heat treating the silicon carbide substrate.

8 Claims, 4 Drawing Sheets

(56) References Cited

U.S. PATENT DOCUMENTS

2017/0114475 A1* 4/2017 Yabuki ................ H01L 21/3065
2018/0312992 A1 11/2018 Kaneko et al.

FOREIGN PATENT DOCUMENTS

| JP | 2016-037426 A | 3/2016 |
| JP | 2017-088444 A | 5/2017 |
| JP | 2019-026499 A | 2/2019 |
| JP | 2019-026500 A | 2/2019 |
| JP | 2019026500 * | 2/2019 |

OTHER PUBLICATIONS

English translation of International Search Report from PCT/JP2021/013747 dated Jun. 22, 2021 (2 pages).

* cited by examiner

LARGE ← STRAINS → SMALL

LARGE ← STRAINS → SMALL

SILICON CARBIDE SUBSTRATE MANUFACTURING METHOD, SILICON CARBIDE SUBSTRATE, AND METHOD OF REMOVING STRAIN LAYER INTRODUCED INTO SILICON CARBIDE SUBSTRATE BY LASER PROCESSING

CROSS-REFERENCE TO RELATED APPLICATIONS

This application is a 371 of PCT Application No. PCT/JP2021/013747, filed on Mar. 30, 2021, which claims priority to Japanese Application No. 2020-072551, filed on Apr. 14, 2020, the contents of which are hereby incorporated by reference as if recited in their entirety.

TECHNICAL FIELD

The present invention relates to a method for manufacturing a silicon carbide substrate, a silicon carbide substrate, and a method for removing a strained layer introduced into the silicon carbide substrate by laser processing.

BACKGROUND ART

In the manufacture of a semiconductor substrate, a method of processing a semiconductor substrate by irradiating the semiconductor substrate with a laser has been conventionally adopted.

Patent Literature 1 discloses an invention in which a converging point of a laser beam having a wavelength with absorbency with respect to an object to be processed is positioned on an upper surface of the object to be processed, the object to be processed is irradiated with the laser beam, and ablation processing is performed to form a groove on the upper surface of the object to be processed. Furthermore, it can be understood that the invention described in Patent Literature 1 is a method that can be applied to a known semiconductor material.

CITATION LIST

Patent Literature

Patent Literature 1: JP H10-305420 A

SUMMARY OF INVENTION

Technical Problem

By the way, in the method of irradiating the object to be processed with the laser beam described above, strains can be introduced into the semiconductor substrate that is the object to be processed due to the irradiation. The strains become a cause of dislocation in the semiconductor substrate, and thus it is desirable that the strains can be removed.

For example, when dislocations occur in the silicon carbide substrate, it is possible that the dislocations are taken over to a growth layer formed by an epitaxial growth using the silicon carbide substrate as an underlying substrate. Therefore, it is desirable that the strains in the silicon carbide substrate can be removed.

An object of the present invention is to provide a novel technique capable of removing a strained layer introduced into a silicon carbide substrate by laser processing.

Solution to Problem

The present invention that is intended to solve the problems described above is a method for manufacturing a silicon carbide substrate, the method including: a processing step of performing laser processing of removing a part of a silicon carbide substrate by irradiating the silicon carbide substrate with a laser; and a strained layer removal step of removing a strained layer introduced into the silicon carbide substrate by the processing step via heat treating the silicon carbide substrate. In this way, in the present invention, the strained layer introduced into the silicon carbide substrate can be removed. As described above, in the present invention, the strained layer introduced into the silicon carbide substrate by the laser processing can be removed.

In a preferred mode of the present invention, the processing step is a step of forming through holes in the silicon carbide substrate. As described above, in the present invention, it is possible to form a temperature gradient in a lateral direction serving as a driving force in a crystal growth proceeding along an a-axis direction.

In a preferred mode of the present invention, the strained layer removal step is a step of etching the silicon carbide substrate in a quasi-closed space.

In a preferred mode of the present invention, the strained layer removal step is a step of etching the silicon carbide substrate under a silicon atmosphere. As described above, the present invention can planarize an upper wall and a side wall on the silicon carbide substrate surface.

Furthermore, the present invention also relates to a method for removing a strained layer introduced into a silicon carbide substrate by a laser processing, the method including a strained layer removal step of heat treating the silicon carbide substrate. In other words, the present invention that is intended to solve the problems described above is a method for removing the strained layer introduced into the silicon carbide substrate by the laser processing, the method including the strained layer removal step of performing heat treatment on the silicon carbide substrate after performing the laser processing on the silicon carbide substrate.

In a preferred mode of the present invention, the strained layer removal step is a step of etching the silicon carbide substrate in a quasi-closed space.

In a preferred mode of the present invention, the strained layer removal step is a step of etching the silicon carbide substrate under a silicon atmosphere.

Advantageous Effects of Invention

According to the technique disclosed, it is possible to provide a novel technique capable of removing the strained layer introduced into the silicon carbide substrate by the laser processing.

Other problems, features and advantages will become apparent by reading the following description of embodiments as well as understanding the drawings and claims.

DESCRIPTION OF EMBODIMENTS

Figure 1:
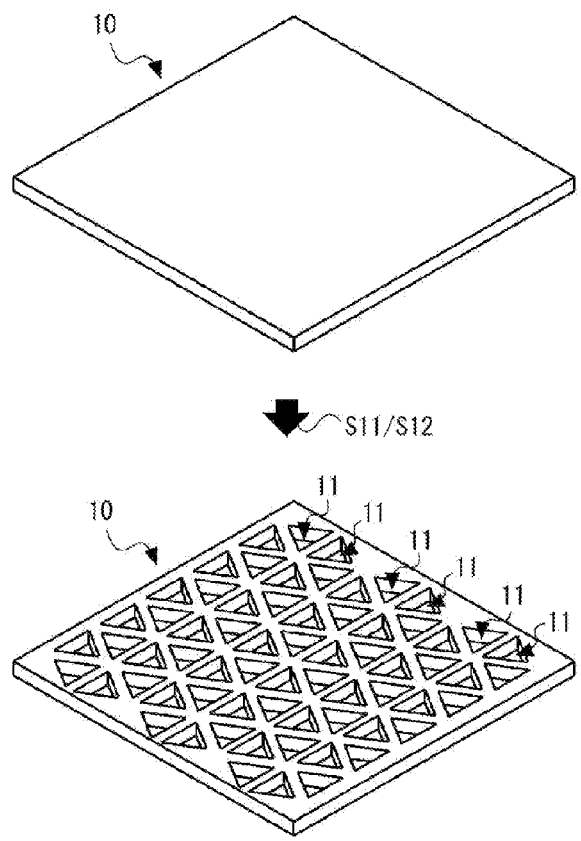
FIG. 1 is an explanatory view for explaining a method for manufacturing a silicon carbide substrate according to an embodiment.

Hereinafter, the preferred embodiments of the method for manufacturing the silicon carbide substrate according to the present invention will be described in detail with reference to the accompanying drawings.

The technical scope of the present invention is not limited to the embodiments illustrated in the accompanying drawings, and can be appropriately changed within the scope described in the claims.

The drawings attached hereto are conceptual diagrams, and the relative dimensions and the like of each member do not limit the present invention.

The present description may be referred to as an upper side or a lower side based on the upper and lower sides of the drawings for the purpose of describing the invention, but the upper and lower sides are not limited in relation to usage modes or the like of the silicon carbide substrate of the present invention.

In addition, in the following description of the embodiments and the accompanying drawings, the same reference numerals are given to the same configurations, and redundant description is omitted.

«Method for Manufacturing Silicon Carbide Substrate»

Figure 2:
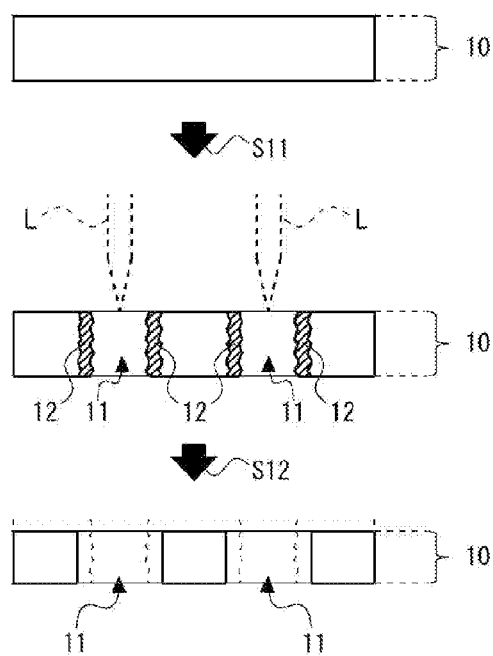
FIG. 2 is an explanatory view for explaining a processing step and a strained layer removal step according to the embodiment.

FIGS. 1 and 2 illustrate steps of a method for manufacturing a silicon carbide substrate (hereinafter, it is simply referred to as a "SiC substrate") according to the embodiment of the present invention.

The method for manufacturing the SiC substrate according to the embodiment may include a processing step S11 of performing the laser processing of removing a part of a SiC substrate 10 by irradiating the SiC substrate 10 with a laser L, and a strained layer removal step S12 of removing a strained layer 12 introduced into the SiC substrate 10 in the processing step S11 by heat treating the SiC substrate 10.

Furthermore, this embodiment can be understood as a method of removing the strained layer 12 introduced into the SiC substrate 10 by the laser processing, the method including the strained layer removal step S12 of heat treating the SiC substrate 10 after performing the laser processing on the SiC substrate 10.

The SiC substrate 10 (corresponding to a SiC wafer) may be a single-crystal SiC substrate, may be a polycrystalline SiC substrate, may be a wafer or substrate processed from a bulk crystal, may be a wafer or substrate including an epitaxial growth layer, or may be a square wafer.

Moreover, in the SiC substrate 10, there are no limitations on crystal polymorph, off direction, off angle, wafer size, substrate thickness, doping concentration, and atomic species of additive element including a dopant element.

Hereinafter, each step of the embodiment will be described in detail.

The processing step S11 is a step of performing the laser processing of removing a part of the SiC substrate 10 by irradiating the SiC substrate 10 with the laser L.

The term "laser processing" in the description of the present description refers to the processing of forming a groove on the upper surface of the SiC substrate 10 or forming a damaged region inside the SiC substrate 10, by positioning the converging point of the laser beam having a wavelength with absorbency with respect to the SiC substrate 10 that is an object to be processed on the upper surface or inside the SiC substrate 10 and by irradiating the SiC substrate 10 with the laser beam.

In addition, the laser processing refers to a method of selectively processing a part of the object to be processed by irradiating the object to be processed with a light wave having energy equivalent to binding energy in a material constituting the object to be processed while controlling a laser irradiation portion (corresponding to the converging point) and converging the light.

Furthermore, the processing step S11 is preferably a step of irradiating the SiC substrate 10 with the laser L having a wavelength of 532 nm.

The wavelength of the laser L is preferably 808 nm or less, preferably 650 nm or less, preferably 635 nm or less, preferably 589 nm or less, preferably 532 nm or less, preferably 473 nm or less, preferably 460 nm or less, preferably 445 nm or less, and preferably 405 nm or less.

Furthermore, the wavelength of the laser L is preferably 355 nm or more, preferably 405 nm or more, preferably 445 nm or more, preferably 460 nm or more, preferably 532 nm or more, preferably 589 nm or more, preferably 635 nm or more, and preferably 650 nm or more.

The wavelength of the laser L is, for example, a wavelength in a wavelength band classified as a visible light region.

Furthermore, the processing step S11 can be performed based on a known or commonly used optical system.

In the processing step S11, a known or conventional light source can be appropriately adopted according to the wavelength of the laser L or the like.

Moreover, the laser L used in the processing step S11 is not limited in terms of its active medium, oscillation form, repetition frequency, pulse width, beam spot diameter, output power, and polarization characteristics.

The optical system used in the processing step S11 appropriately includes a known or conventional mirror, a scanner including an axial rotation motor for alignment and the like, a converging lens, and a grating.

Magnification and numerical aperture (NA) of the converging lens of the optical system used in the processing step S11 are not limited.

Furthermore, the processing step S11 is a step of forming the through holes 11 in the SiC substrate 10.

Here, it can be understood that the processing step S11 is an embrittlement processing step of reducing strength of the SiC substrate 10 by forming the through holes 11.

In addition, in the processing step S11, in the formation of the through holes 11, the laser irradiation portion (corresponding to the converging point) is scanned in a film thickness direction of the SiC substrate 10.

As an example, the through holes 11 can be adopted as long as it has a shape (a pattern) that reduces the strength of the SiC substrate 10.

In addition, as an example, the through holes 11 can be adopted as long as it has a shape (a pattern) including a minor angle.

Furthermore, in the epitaxial growth using the SiC substrate 10 as the underlying substrate, it is desirable to set a shape (pattern) in which a desired growth layer can be obtained.

At this time, in the processing step S11, the laser L is scanned in a plane of the SiC substrate 10 according to the shape (the pattern).

Moreover, in the processing step S11, it is desirable to adopt an optimum pattern by physical properties (crystal orientation and the like) of the semiconductor material of the growth layer or the SiC substrate 10, and by a growth method of the growth layer. Note that a width and a depth of the shape (the pattern) are not limited.

In addition, the processing step S11 is a step of processing the surface of the SiC substrate 10 into a mesa shape.

The term "mesa shape" in the description of the present description corresponds to an uneven shape, and there is no limitation on the angle formed by the upper wall and the side wall in the uneven shape.

In addition, a processing depth in the processing step S11 is not limited.

Furthermore, when the processing step S11 is a step of processing the surface of the SiC substrate 10 into the mesa shape, the processing step S11 forms a concave portion on the surface of the SiC substrate 10 instead of the through holes 11 described above.

Moreover, in the processing step S11, the through holes 11 or a convex portion is formed by scanning a focal point of the laser L from a front surface (corresponding to an upper surface) to a bottom surface (corresponding to a lower surface.) of the SiC substrate 10.

Furthermore, in the processing step S11, at least a part of known techniques such as methods described in, for example, JP H10-305420 A, JP 2002-192370 A, JP 2016-111147 A, and the like, can be appropriately adopted.

The strained layer removal step S12 is a step of removing the strained layer 12 introduced into the SiC substrate 10 by the processing step S11 via heat treating the SiC substrate 10. Moreover, it can be understood that the strained layer 12 corresponds to, for example, a damage layer.

In the strained layer removal step S12, a means for etching the SiC substrate 10 by heat treating the SiC substrate 10 can be adopted.

Furthermore, the strained layer removal step S12 can be naturally adopted as long as it is a means capable of removing the strained layer 12.

Moreover, the strained layer removal step S12 is a step of removing the strained layer 12 by thermal etching.

Furthermore, the strained layer removal step S12 is a step of etching the SiC substrate 10 in the quasi-closed space. Note that the term "quasi-closed space" in the description in the present description refers to a space in which the inside of a container in which the SiC substrate 10 is installed and the inside of a sample chamber can be vacuumed, but at least a part of vapor generated inside the container and inside the sample chamber can be confined.

Furthermore, the strained layer removal step S12 is a step of etching the SiC substrate 10 under a silicon atmosphere (a Si atmosphere). Note that the term "silicon atmosphere" in the description of the present description corresponds to a vapor pressure of a vapor phase type containing Si element.

In addition, as an example, the strained layer removal step S12 is a step of housing the SiC substrate 10 in a SiC container 50, housing the SiC container 50 in a refractory material container such as a TaC container 60, and heat treating the refractory material container including the SiC substrate 10.

At this time, the above refractory material container includes a Si vapor supply source 64 capable of supplying the vapor pressure of the vapor phase type containing Si element to the outside of the SiC container 50.

As an example, the strained layer removal step S12 is a step of housing the SiC substrate 10 in the above refractory material container and heat treating the refractory material container including the SiC substrate 10.

At this time, the refractory material container includes the Si vapor supply source 64 capable of supplying the vapor pressure of the vapor phase type containing Si element.

The term "Si vapor supply source 64" in the description of the present description is, for example, solid Si (Si pellet such as Si piece or Si powder) or a Si compound, and may take a form of thin film.

According to the present invention, it is possible to remove the strained layer 12 introduced into the SiC substrate 10 by the laser processing via including the strained layer removal step S12 of heat treating the SiC substrate 10.

Hereinafter, a mode will be described in which a growth layer 20 is formed by the epitaxial growth using the SiC substrate 10 from which the strained layer 12 has been removed in the strained layer removal step S12 as the underlying substrate.

Note that, according to the embodiment of the present invention, the SiC substrate 10 from which the strained layer 12 has been removed, for example, can be provided as the underlying substrate for the epitaxial growth of materials such as SiC and AlN.

<Crystal Growth Step S20>

The crystal growth step S20 is a step of forming the growth layer 20 on the SiC substrate 10 after the strained layer removal step S12.

The material of the growth layer 20 may be the same material as the SiC substrate 10 (corresponding to a homoepitaxial growth) or may be a material different from the SiC substrate 10 (corresponding to a heteroepitaxial growth).

The material of the growth layer 20 may be a material that is generally epitaxially grown.

In addition, the material of the growth layer 20 may be the material of the SiC substrate 10, may be a known material that can be adopted as the material of the SiC substrate 10, or may be a known material that can be epitaxially grown on the SiC substrate 10.

The material of the growth layer 20 according to the embodiment is, for example, AlN.

In addition, the crystal growth step S20 is preferably a step of forming the growth layer 20 by physical vapor transport (PVT) method.

In the crystal growth step S20, a known vapor phase growth method (corresponding to a vapor phase epitaxial method) such as PVT, a sublimation recrystallization method, an improved Rayleigh method, or a chemical vapor transport (CVT) method can be adopted as a growth method of the growth layer 20.

Furthermore, in the crystal growth step S20, a physical vapor deposition (PVD) can be adopted instead of PVT. Moreover, in the crystal growth step S20, a chemical vapor deposition (CVD) can be adopted instead of CVT.

Then, in the crystal growth step S20, as a growth method of the growth layer 20, a known liquid phase growth method (corresponding to a liquid phase epitaxial method) such as a top-seeded solution growth (TSSG) method or a metastable solvent epitaxy (MSE) method can be adopted.

In addition, in the crystal growth step S20, a Czochralski (CZ) method can be adopted as a growth method of the growth layer 20.

In the crystal growth step S20, a growth method can be appropriately selected and adopted according to the respective materials of the SiC substrate 10 and the growth layer 20.

Figure 3:
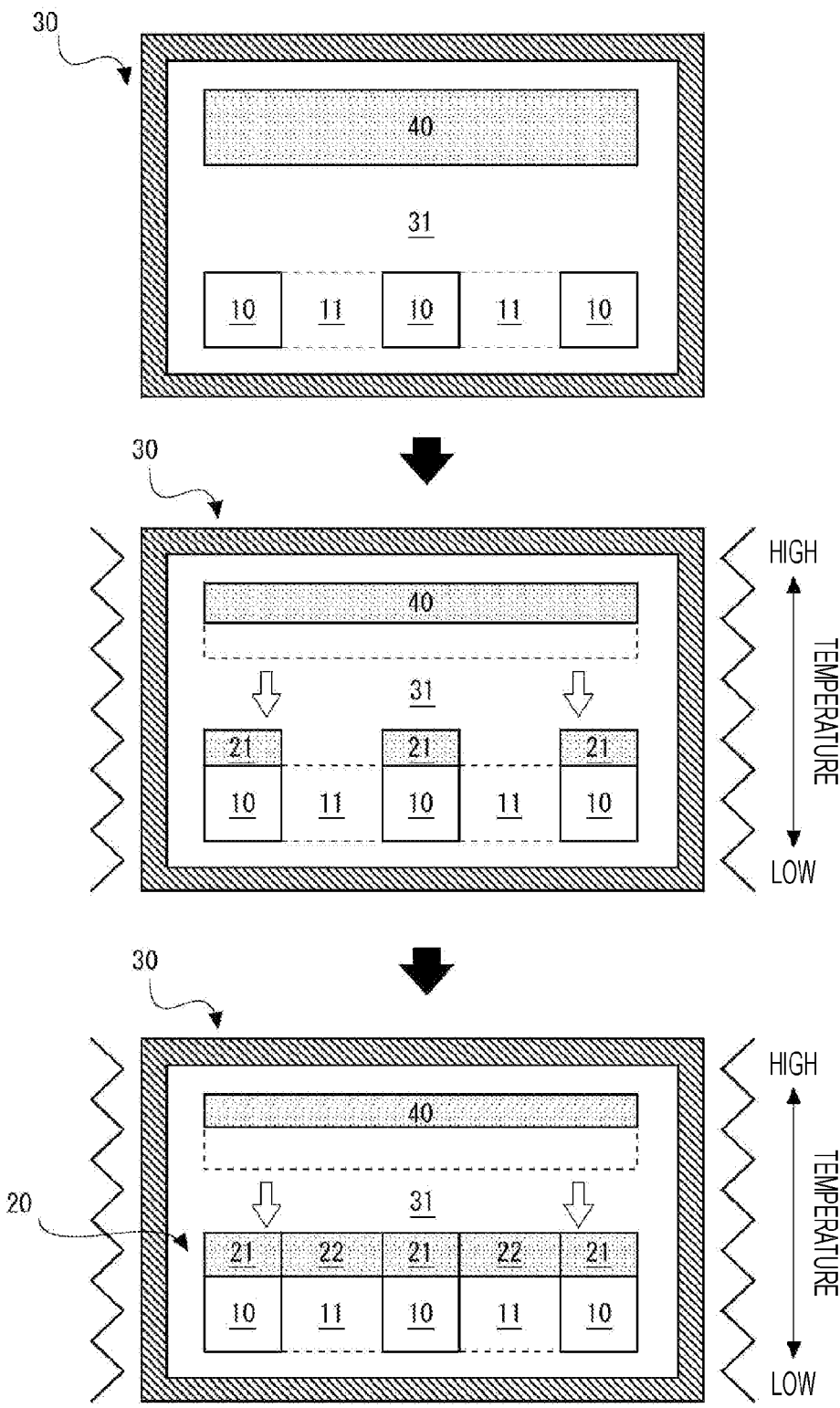
FIG. 3 is an explanatory view for explaining a crystal growth step according to the embodiment.

FIG. 3 is an explanatory view for explaining the crystal growth step S20 according to the embodiment.

The crystal growth step S20 according to the embodiment is a step in which the SiC substrate 10 and a semiconductor material 40 serving as a source of the growth layer 20 are disposed and heated in such a way as facing (confronting) each other in a crucible 30 having the quasi-closed space.

By heating the crucible 30 (the SiC substrate 10 and the semiconductor material 40), the source is transported from the semiconductor material 40 onto the SiC substrate 10 via a source transport space 31.

In addition, in the crystal growth step S20, the temperature gradient can be adopted as the driving force for transporting the source between the SiC substrate 10 and the semiconductor material 40.

Here, in the crystal growth step S20, a vapor composed of atomic species sublimated from the semiconductor material 40 is transported by diffusing in the source transport space 31, and is supersaturated and condensed on the SiC substrate 10 set to have a temperature lower than that of the semiconductor material 40.

In addition, in the crystal growth step S20, a chemical potential difference between the SiC substrate 10 and the semiconductor material 40 can be adopted as the driving force described above.

Here, in the crystal growth step S20, the vapor composed of atomic species sublimated from the semiconductor material 40 is transported by diffusing in the source transport space 31, and is supersaturated and condensed on the SiC substrate 10 having a chemical potential lower than that of the semiconductor material 40.

Furthermore, the crystal growth step S20 is a step of forming a land portion 21 by performing the crystal growth (corresponding to a c-axis dominant growth) along a c-axis direction from the SiC substrate 10 and forming a wing portion 22 by performing the crystal growth (corresponding to an a-axis dominant growth.) along the a-axis direction from the land portion 21 to form the growth layer 20. In addition, the a-axis dominant growth may include the crystal growth along the a-axis direction from the side surface of the through holes 11 or the side surface of the concave portion.

The growth layer 20 includes the land portion 21 and the wing portion 22. The through holes 11 or the concave portion according to the embodiment are located immediately below the wing portion 22.

The "c-axis dominant growth" and the "a-axis dominant growth" in the description of the present description can be appropriately controlled based on the heating conditions in the crystal growth step S20.

The above heating conditions are, for example, the temperature gradient in the c-axis direction and the a-axis direction, and may include a history of such temperature gradient. The history corresponds to a transition or change of the temperature gradient during heating.

In addition, the above heating conditions are, for example, a back pressure or a partial pressure of an inert gas containing nitrogen gas, and may include a history of such pressure. The history corresponds to a transition or change of the back pressure or the like during heating.

The above heating conditions are, for example, heating temperature, and may include a history of such heating temperature. The history corresponds to a transition or change of heating temperature or the like during heating.

Furthermore, in the crystal growth step S20, the control/switching of the c-axis dominant growth and the a-axis dominant growth may be performed, for example, based on the conditions, methods, and the like described in D. Dojima, et al., Journal of Crystal Growth, 483, 206 (2018).

Moreover, in the crystal growth step S20, the doping concentration of the growth layer 20 may be adjusted using a doping gas. In addition, in the crystal growth step S20, the doping concentration of the growth layer 20 may be adjusted by adopting the semiconductor material 40 having a doping concentration different from that of the SiC substrate 10.

EXAMPLE

Figure 4:
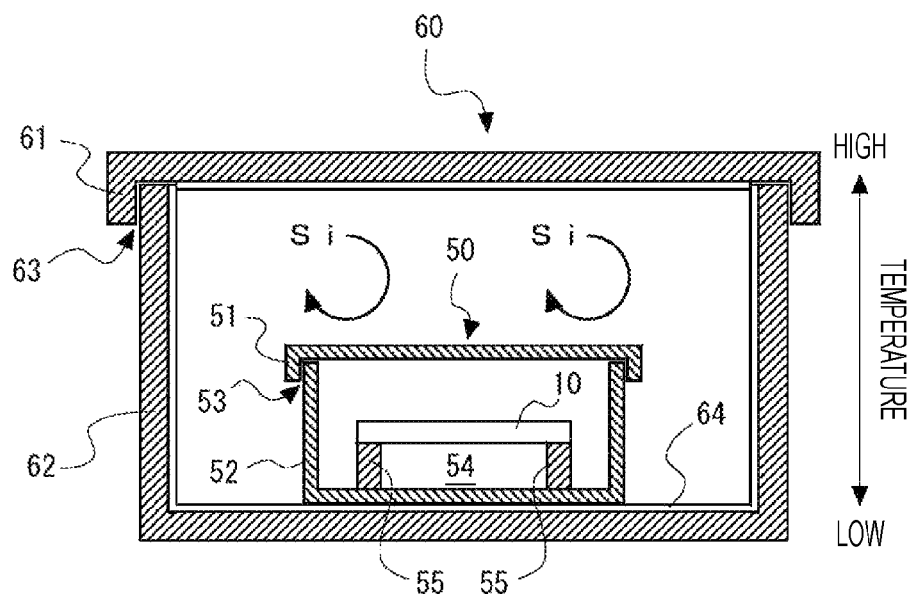
FIG. 4 is an explanatory view for explaining a strained layer removal step according to the example.
Figure 6:
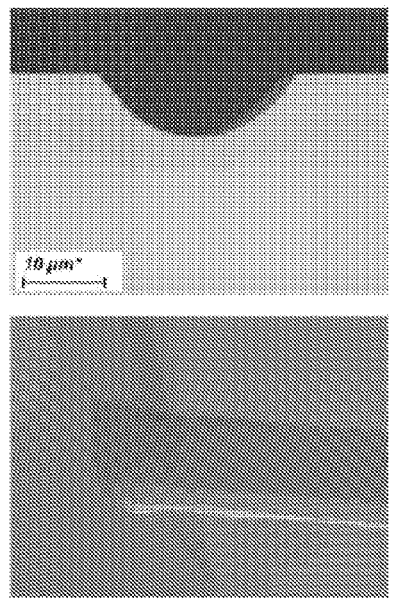
FIG. 6 is an observation image of a silicon carbide substrate according to the example.

The present invention will be described more specifically with reference to the example.
(SiC Substrate 10)
   Semiconductor material: 4H-SiC
   Substrate size: width 10 mm×length 10 mm×thickness 524 μm
(Processing Step S11)
   The processing step S11 according to the example is a step of irradiating the SiC substrate 10 with a laser to form the through holes 11.
(Laser Processing Conditions)
   Wavelength: 532 nm
   Output power: 3 W/cm$^2$
   Spot diameter: 40 μm
(Strained Layer Removal Step S12)
   FIG. 4 is an explanatory view for explaining the strained layer removal step S12 according to the example.
   In the strained layer removal step S12 according to the example, the SiC substrate 10 is housed in the SiC container 50, and the SiC container 50 is further housed in the TaC container 60 to be heated.
(SiC Container 50)
   Material: polycrystalline SiC
   Container size: diameter 60 mm×height 4 mm
   Distance between the SiC substrate 10 and the bottom surface of the SiC container 50: 2 mm
(Details of SiC Container 50)
   As illustrated in FIG. 6, the SiC container 50 is a fitting container including an upper container 51 and a lower container 52 that can be fitted to each other.
   A gap 53 is formed in a fitting portion between the upper container 51 and the lower container 52, and the SiC container 50 can be exhausted (evacuated) from the gap 53.
   The SiC container 50 has an etching space 54 formed by making a part of the SiC container 50 arranged on the low temperature side of the temperature gradient face the SiC substrate 10 in a state where the SiC substrate 10 is arranged on the high temperature side of the temperature gradient.
   The etching space 54 is a space for transporting and etching Si atoms and C atoms from the SiC substrate 10 to the SiC container 50 using a temperature difference provided between the SiC substrate 10 and the bottom surface of the SiC container 50 as the driving force.
   In addition, the SiC container 50 includes a substrate holder 55 that holds the SiC substrate 10 in a hollow state to form the etching space 54.
   Furthermore, the SiC container 50 may not be provided with the substrate holder 55 depending on the direction of the temperature gradient of a heating furnace.
   For example, when the SiC container 50 forms the temperature gradient such that the heating furnace decreases in temperature from the lower container 52 toward the upper container 51, the SiC substrate 10 may be disposed on the bottom surface of the lower container 52 without providing the substrate holder 55.

(Details of TaC Container 60)

Similarly to the SiC container 50, the TaC container 60 is a fitting container including an upper container 61 and a lower container 62 that can be fitted to each other, and is configured to be able to house the SiC container 50.

A gap 63 is formed in a fitting portion between the upper container 61 and the lower container 62, and the TaC container 60 can be exhausted (evacuated) from the gap 63.

The TaC container 60 includes the Si vapor supply source 64 capable of supplying the vapor pressure of the vapor phase type containing Si element to the TaC container 60.

The Si vapor supply source 64 may be configured to generate the vapor pressure of the vapor phase type containing Si element in the TaC container 60 during heat treatment.

(Heating Conditions)

The SiC substrate 10 disposed under the conditions described above was subjected to heat treatment under the following conditions.

Heating temperature: 1800° C.
Etching amount: 8 μm

Furthermore, in the strained layer removal step S12, the heating time and the temperature gradient are appropriately set in order to realize the following etching amount.

Figure 5:
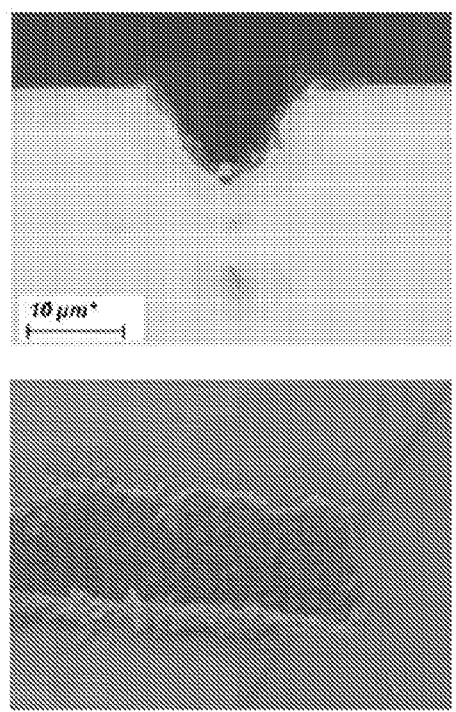
FIG. 5 is an observation image of a silicon carbide substrate according to the example.

FIG. 5 illustrates a cross-sectional SEM image and a bird's-eye view SEM image of the SiC substrate 10 after the processing step S11.

FIG. 6 illustrates a cross-sectional SEM image and a bird's-eye view SEM image of the SiC substrate 10 subjected to the processing step S11 and the strained layer removal step S12.

According to FIGS. 5 and 6, it can be understood that the surface of the SiC substrate 10 is planarized by the strained layer removal step S12.

Figure 7:
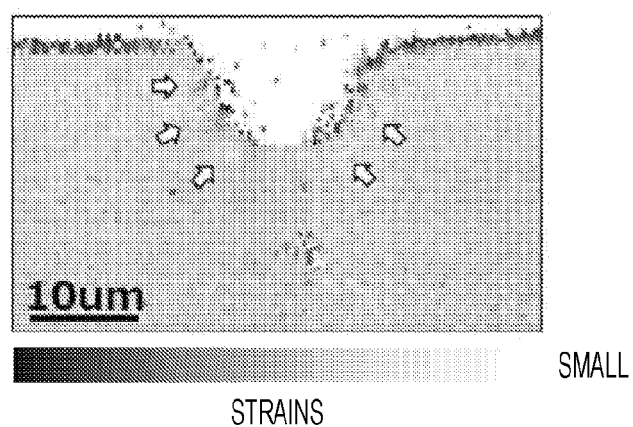
FIG. 7 is a diagram illustrating a strain distribution of a silicon carbide substrate according to the example.

FIG. 7 illustrates an EBSD mapping image of the SiC substrate 10 subjected to the processing step S11.

Figure 8:
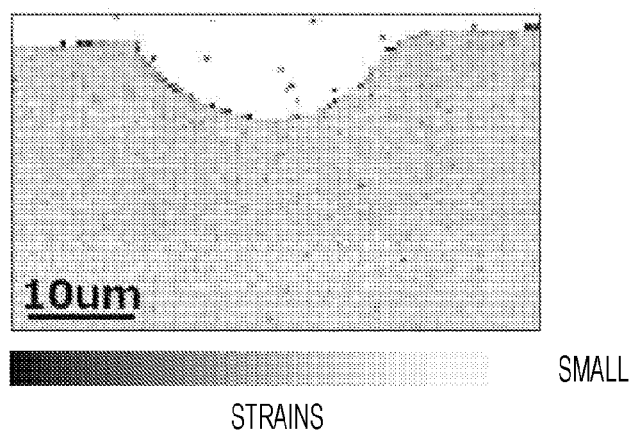
FIG. 8 is a diagram illustrating a strain distribution of a silicon carbide substrate according to the example.

FIG. 8 illustrates an EBSD mapping image of the SiC substrate 10 subjected to the processing step S11 and the strained layer removal step S12.

FIGS. 7 and 8 illustrate mapping images of the shear strained component $E_{12}$.

According to FIGS. 7 and 8, it can be understood that the strains of the SiC substrate 10 are removed by the strained layer removal step S12.

According to the present invention, the strained layer 12 that is introduced into the SiC substrate 10 in the process of pattern formation by the laser processing can be removed.

Accordingly, density of defects such as dislocations in the vicinity of each of the upper wall and the side wall of the pattern can be reduced, and takeover of defects such as dislocations in the crystal growth (corresponding to the epitaxial growth) in which the growth surface advances from the upper wall and/or the side wall can be suppressed.

10 SiC substrate
11 Through hole
12 Strained layer
30 Crucible
31 Source transport space
40 Semiconductor material
50 SiC container
60 TaC container
S11 Processing step
S12 Strained layer removal step

The invention claimed is:

1. A method for manufacturing a silicon carbide substrate, the method comprising: a processing step of performing laser processing of removing a part of the silicon carbide substrate by irradiating the silicon carbide substrate with a laser; and a strained layer removal step of removing a strained layer introduced into the silicon carbide substrate by the processing step via heat treating the silicon carbide substrate, wherein the strained layer removal step comprises housing the silicon carbide substrate in a SiC container made of a polycrystalline SiC, and thermal etching the silicon carbide substrate.

2. The method for manufacturing a silicon carbide substrate according to claim 1, wherein the strained layer removal step is a step of etching the silicon carbide substrate in a quasi-closed space.

3. The method for manufacturing a silicon carbide substrate according to claim 2, wherein the strained layer removal step is a step of etching the silicon carbide substrate under a silicon atmosphere.

4. The method for manufacturing a silicon carbide substrate according to claim 1, wherein the strained layer removal step is a step of etching the silicon carbide substrate under a silicon atmosphere.

5. A method for manufacturing a silicon carbide substrate, the method comprising:

a processing step of performing laser processing of removing a part of the silicon carbide substrate by irradiating the silicon carbide substrate with a laser; and a strained layer removal step of removing a strained layer introduced into the silicon carbide substrate by the processing step via heat treating the silicon carbide substrate, wherein the strained layer removal step comprises housing the silicon carbide substrate in a SiC container, and thermal etching the silicon carbide substrate, wherein the processing step is a step of forming through holes in the silicon carbide substrate.

6. The method for manufacturing a silicon carbide substrate according to claim 5, wherein the strained layer removal step is a step of etching the silicon carbide substrate in a quasi-closed space.

7. The method for manufacturing a silicon carbide substrate according to claim 6, wherein the strained layer removal step is a step of etching the silicon carbide substrate under a silicon atmosphere.

8. The method for manufacturing a silicon carbide substrate according to claim 5, wherein the strained layer removal step is a step of etching the silicon carbide substrate under a silicon atmosphere.

* * * * *